United States Patent [19]
Craft

[11] Patent Number: 5,874,907
[45] Date of Patent: Feb. 23, 1999

[54] METHOD AND APPARATUS FOR PROVIDING IMPROVED DATA COMPRESSION EFFICIENCY FOR AN ADAPTIVE DATA COMPRESSOR

[75] Inventor: David John Craft, Austin, Tex.

[73] Assignee: International Business Machines Corporation, Armonk, N.Y.

[21] Appl. No.: 934,335

[22] Filed: Sep. 19, 1997

[51] Int. Cl.[6] .................................................. H03M 7/00
[52] U.S. Cl. .............................................. 341/51; 341/63
[58] Field of Search ................................. 341/50, 51, 58, 341/59, 63

[56] References Cited

U.S. PATENT DOCUMENTS

| | | | |
|---|---|---|---|
| 4,679,094 | 7/1987 | Rutherford et al. | 358/261 |
| 5,016,009 | 5/1991 | Whiting et al. | 341/67 |
| 5,177,622 | 1/1993 | Yoshida et al. | 358/429 |
| 5,486,826 | 1/1996 | Remillard | 341/51 |
| 5,608,396 | 3/1997 | Cheng et al. | 341/50 |
| 5,612,693 | 3/1997 | Craft et al. | 341/51 |
| 5,627,534 | 5/1997 | Craft et al. | 341/87 |
| 5,652,878 | 7/1997 | Craft et al. | 395/601 |
| 5,668,547 | 9/1997 | Lee | 341/63 |

OTHER PUBLICATIONS

QIC Development Standard, Adaptive Lossless Data Compression (ALDC), QIC–154, Revision A, Mar. 10, 1994.

Jacob Ziv and Abraham Lempel, A Universal Algorithm for Sequential Data Compression, IEEE Transactions on Information Theory, vol. IT–23, No. 3, May 1977.

James A. Storer and Thomas G. Szymanski, Data Compression via Textual Substitution, Journal of the Association for Computing Machinery, vol. 29, No. 4, Oct. 1982, pp. 928–951.

Timothy C. Bell, Better OPM/L Text Compression, IEEE Transactions on Communications, vol. Com–34, No. 12, Dec. 1986.

*Primary Examiner*—Marc S. Hoff
*Assistant Examiner*—Peguy JeanPierre
*Attorney, Agent, or Firm*—Casimer K. Salys; Antony P. Ng; Andrew J. Dillon

[57] ABSTRACT

A method for providing improved data compression efficiency to a data compressor unit is disclosed. Before sending the uncompressed data stream to the data compressor unit, an incoming data byte from the uncompressed data stream is first compared with a preceding data byte from the uncompressed data stream. A first counter value is incremented in response to a match between the incoming data byte and the preceding data byte. A second counter value is then incremented in response to subsequent matches between an incoming data byte and its preceding data byte after the first counter value has reached a preset value. The second counter value is finally sent to the data compressor unit at the completion of a run of the incoming data byte in substitution of a portion of the run, such that the data compressor unit can quickly resume its optimal compression ratio after an occurrence of the run within the uncompressed data stream.

14 Claims, 5 Drawing Sheets

| STATE | ACTION | GO TO |
|---|---|---|
| (00) | Available_Flag, First_Counter, Second_Counter set to zero | (01) |
| (01) | Await input Data_Byte request from Compressor | (02) |
| (02) | Is Available_Flag set to 0 ? | YES (04), NO (03) |
| (03) | Deliver previously saved new Data_Byte to compressor | (00) |
| (04) | Fetch new Data_Byte from a data source | (05) |
| (05) | Is First_Counter at Preset_Limit ? | YES (10), NO (08) |
| (06) | Is new Data_Byte identical to Previous_Byte ? | YES (08), NO (07) |
| (07) | Reset First_Counter to zero | (09) |
| (08) | Increment First_Counter by 1 | (09) |
| (09) | Deliver new Data_Byte to Compressor | (01) |
| (10) | Is new Data_Byte identical to Previous_Byte ? | YES (13), NO (11) |
| (11) | Deliver Second_Counter value to Compressor | (12) |
| (12) | Set Available_Flag to 1 | (01) |
| (13) | Increment Second_Counter by 1 | (14) |
| (14) | Is Second_Counter at its maximum value ? | YES (15), NO (04) |
| (15) | Deliver Second_Counter value to Compressor | (16) |
| (16) | Reset Second_Counter value to 01 | (01) |

*Fig. 3*

| STATE | ACTION | GO TO |
|---|---|---|
| (00) | Extension_Flag, First_Counter, Second_Counter set to zero | (01) |
| (01) | Await output of new Data_Byte request from Decompressor | (02) |
| (02) | Is Extension_Flag set to 0 ? | YES (13), NO (03) |
| (03) | Load new Data_Byte value to Second_Counter | (04) |
| (04) | Is Second_Counter at its maximum value ? | YES (09), NO (05) |
| (05) | Reset Extension_Flag to zero | (06) |
| (06) | Is Second_Counter value at 0 ? | YES (00), NO (07) |
| (07) | Deliver previous Data_Byte to output | (08) |
| (08) | Decrement Second_Counter by 1 | (06) |
| (09) | Set Extension_Flag to 1 | (10) |
| (10) | Deliver previous Data_Byte to output | (11) |
| (11) | Decrement Second_Counter by 1 | (12) |
| (12) | Is Second_Counter value greater than 1 ? | YES (10), NO (01) |
| (13) | Is First_Counter at Preset_Limit ? | YES (03), NO (14) |
| (14) | Deliver new Data_Byte to output | (15) |
| (15) | Is new Data_Byte identical to Previous_Byte ? | YES (17), NO (16) |
| (16) | Reset First_Counter to zero | (01) |
| (17) | Increment First_Counter by 1 | (01) |

*Fig. 4*

METHOD AND APPARATUS FOR PROVIDING IMPROVED DATA COMPRESSION EFFICIENCY FOR AN ADAPTIVE DATA COMPRESSOR

BACKGROUND OF THE INVENTION

1. Technical Field

The present invention relates to a method and apparatus for compressing data in general, and in particular to a method and apparatus for performing adaptive data compression. Still more particularly, the present invention relates to a method and apparatus for providing improved data compression efficiency for an adaptive data compressor.

2. Description of the Prior Art

The type of data presented to a compression algorithm to be compressed can vary enormously. Therefore, most compression algorithms are made to be adaptive in nature in order to attain a better compression performance over a wide range of data types. Both the classical Lempel-Ziv 1 (LZ_1) and Lempel-Ziv 2 (LZ_2) compression algorithms embody this concept to a certain degree.

In the LZ_1 case, every byte processed is moved to a history-buffer that is initially empty. This history-buffer can be thought of as a byte-wide shift register, and once the history-buffer is completely filled, each new incoming data byte will displace the oldest data byte from the history-buffer. The current content within the history-buffer is compared with the incoming data to identify any matching strings or sequences of incoming data bytes that have occurred earlier, which still remain in the history-buffer. This incoming data sequence is then encoded in a more compact form, giving the starting point of the matching string within the history-buffer and the length of the matching string, and this forms the basis of the LZ_1 compression algorithm. A LZ_1 decompressor maintains a history-buffer with an identical data history to the history-buffer within the LZ_1 compressor, and simply copies such strings as its output when decoding a reference.

In the LZ_2 case, a dictionary of data sequences is maintained, and references to these dictionary entries constitute the basis of the LZ_2 compression algorithm. It is not necessary to encode a length when the incoming data matches one of the dictionary entries because the length is also held in the dictionary. Hence, compressed output data from a LZ_2 compression algorithm usually consists of only a sequence of numbers, representing dictionary entries. Adaptive LZ_2 implementations continually add new dictionary entries based on the incoming data. As in the LZ_1 case, both LZ_2 compressor and LZ_2 decompressor start with and maintain an identical structure, although in the case of LZ_2, different management strategies are utilized when the dictionary becomes full.

Typically, a data stream to be compressed is frequently found to contain sequences of identical characters, commonly known as "runs." For example, executable code often contains significant runs of "00" characters. Also, code compilers often generate null data to initialize arrays or variables to a known state. Further, database software often allocates data fields with either all blank or all zero characters. In addition, binary bitmap image data often contain a great deal of "whitespaces," typically "00" characters, representing eight pixels which are all blank. Otherwise, grey scale or color image data, especially, which is encoded utilizing one byte per pixel, may also contain long runs of identical data bytes.

These kinds of runs may lead to unnecessary and unproductive adaptations within a data compressor. Furthermore, because a history-buffer in LZ_1 or a dictionary in LZ_2 may easily be overflowed with identical data bytes from a run, it will take a while for the data compressor to resume its optimal compression ratio after the run. Consequently, it would be desirable to provide a method and apparatus to render better data compression efficiency to a data compressor such that the data compressor may be able to resume its optimal compression efficiency more rapidly after an occurrence of a run.

SUMMARY OF THE INVENTION

In view of the foregoing, it is therefore an object of the present invention to provide an improved method and apparatus for compressing data.

It is another object of the present invention to provide an improved method and apparatus for performing adaptive data compression.

It is yet another object of the present invention to provide an improved method and apparatus for providing better data compression efficiency for an adaptive data compressor.

In accordance with a method of the present invention, an uncompressed data stream is sent to a data compressor unit. But before sending the uncompressed data stream to the data compressor unit, and incoming data byte from the uncompressed data stream is first compared with the preceding data byte from the uncompressed data stream. A first counter value is incremented in response to a match between the incoming data byte and the preceding data byte. A second counter value is then incremented in response to subsequent matches between an incoming data byte and its preceding data byte after the first counter value has reached a preset value. The second counter value is finally sent to the data compressor unit at the completion of a run of the incoming data byte in substitution of a portion of the run, such that the data compressor unit can quickly resume its optimal compression ratio after an occurrence of the run within the uncompressed data stream.

All objects, features, and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein:

FIG. 1b is a block diagram of a data decompressor unit in which a preferred embodiment of the present invention may be incorporated;

FIG. 3 is a state diagram of a method for providing improved data compression efficiency for a data pre-compressor, in accordance with a preferred embodiment of the present invention; and FIG. 4 is a state diagram of a method for providing improved data compression efficiency for a data post-compressor, in accordance with a preferred embodiment of the present invention.

DETAILED DESCRIPTION OF A PREFERRED EMBODIMENT

The present invention may be implemented along with many types of adaptive data compression algorithms, such as Lempel-Ziv 1, Lempel-Ziv 2, etc. It will be understood by those skilled in the art that the present invention may be implemented in either hardware or software.

Figure 1A:
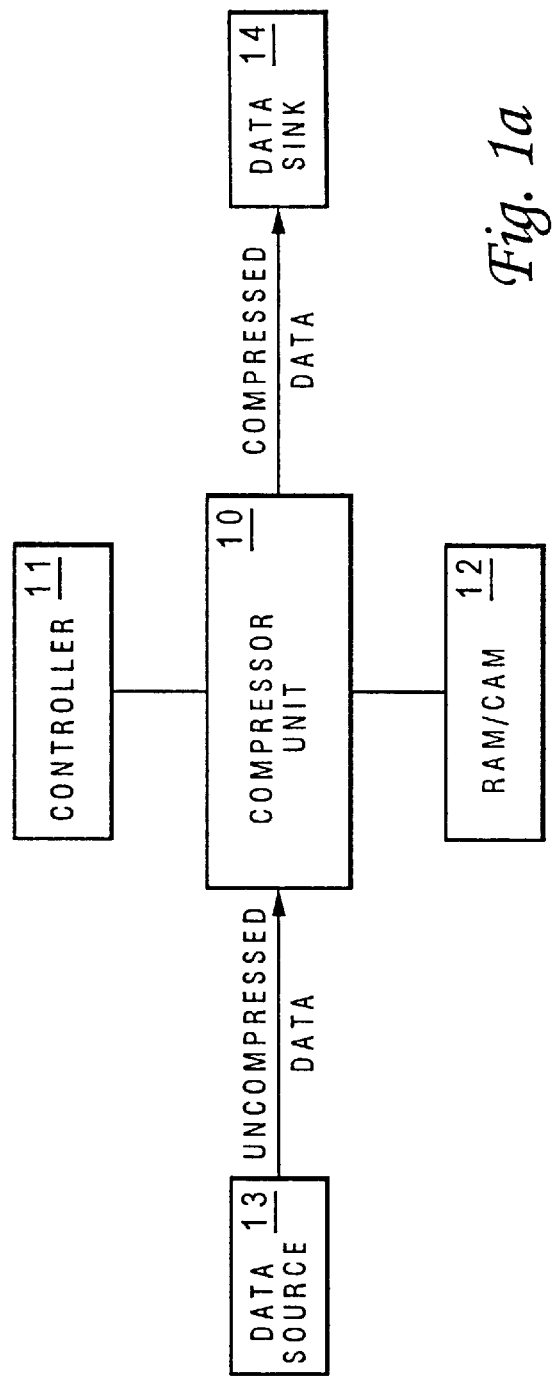
FIG. 1a is a block diagram of a data compressor unit in which a preferred embodiment of the present invention may be incorporated.
Figure 16:
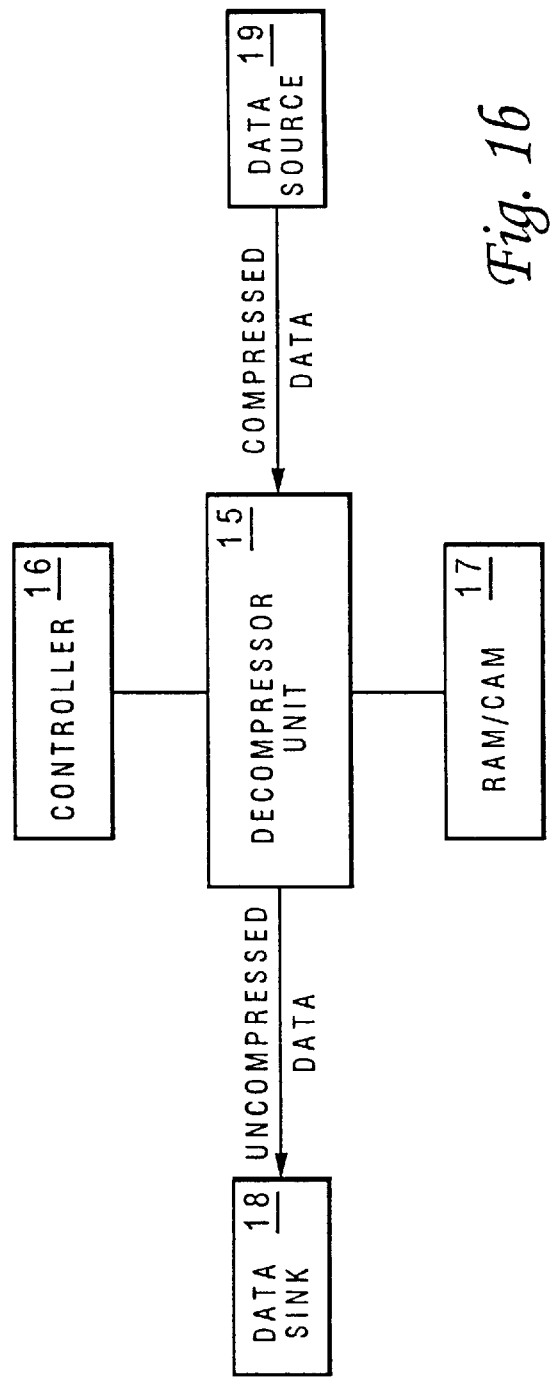

Referring now to the drawings and in particular to FIG. 1a, there is depicted a block diagram of a data compressor unit in which a preferred embodiment of the present invention may be incorporated. As shown, compressor unit 10 is coupled to a controller 11 and a random-access memory (RAM) or a content-addressable memory (CAM) 12. Any type of adaptive compression algorithms may be implemented within compressor unit 10. Examples of adaptive compression algorithms include classical algorithms such as Lempel-Ziv 1 and Lempel-Ziv 2 that are well-known to those skilled in the art, or a more contemporary algorithm such as Adaptive Lossless Data Compression (ALDC) described in "QIC Development Standard QIC-154," Revision A, 10 Mar. 94, Quarter-Inch Cartridge Drive Standards, Inc of which the subject matter is incorporated by reference herein. All data structures associated with the chosen compression algorithm, such as a history-buffer for Lempel-Ziv 1 or a dictionary for Lempel-Ziv 2, are maintained within RAM/CAM 12. As such, the optimal size of RAM/CAM 12 depends on the type of compression algorithm utilized within compressor unit 10. During operation, an uncompressed data stream is first received by compressor unit 10 from a data source 13. After data-encoding, a compressed data stream is then transmitted to a data sink 14.

Referring now to FIG. 1b, there is depicted a block diagram of a data decompressor unit in which a preferred embodiment of the present invention may be incorporated. As shown, decompressor unit 15 is coupled to a controller 16 and a RAM 17. Similar to RAM 12, all data structures for decompressor unit 15 are maintained within RAM 17 and the size of RAM 17 depends on the type of compression algorithm utilized within compressor unit 10. During operation, a compressed data stream is first received by decompressor unit 15 from data source 19. After data-decoding, an uncompressed data stream will then be transmitted from decompressor unit 15 to a data sink 18.

Figure 2:
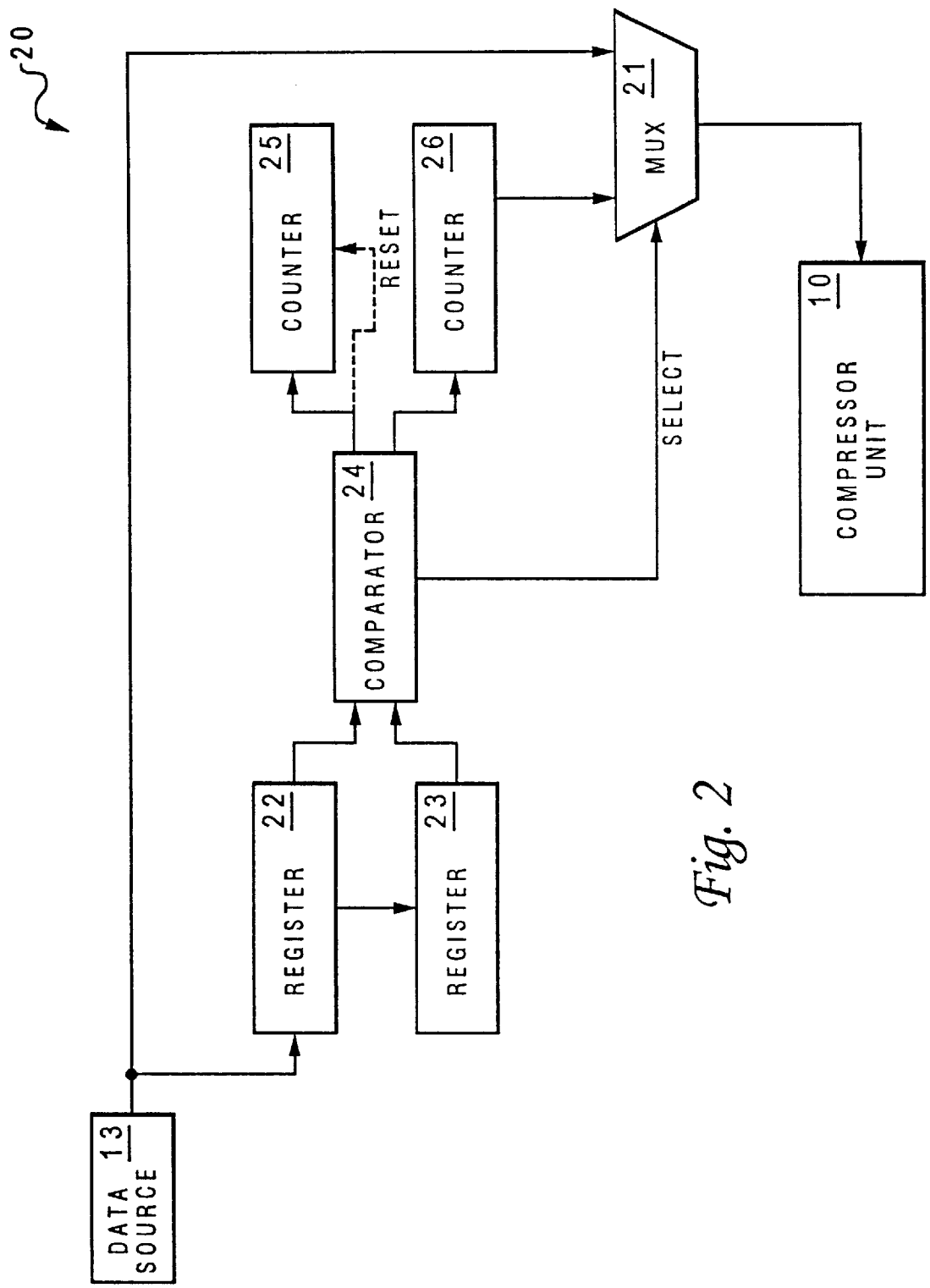
FIG. 2 is a block diagram of a data pre-compressor for providing improved compression efficiency to a data compressor unit, in accordance with a preferred embodiment of the present invention.

With reference now to FIG. 2, there is illustrated a block diagram of a data pre-compressor for providing improved compression efficiency to compressor unit 10 of FIG. 1a, in accordance with a preferred embodiment of the present invention. Pre-compressor unit 20 is preferably coupled between data source 13 and compressor unit 10. As shown, pre-compressor unit 20 includes a first register 22, a second register 23, a comparator 24, a first counter 25, a second counter 26, and a multiplexor 21.

During operation, each incoming data byte from an uncompressed data stream is first stored in first register 22. This incoming data byte will be sent to second register 23 upon the arrival of another incoming data byte from the uncompressed data stream. Hence, second register 23 retains the value of a previous (i.e. immediately preceding) data byte from the uncompressed data stream. The incoming data byte stored in first register 22 is then compared with the previous data byte stored in second register 23 utilizing comparator 24. First counter 25 is initially reset to zero, but first counter 25 will be incremented each time there is a match between the data byte stored in first register 22 and the data byte stored in second register 23, indicated by comparator 24. Otherwise, first counter 25 will be reset again if there is a mismatch between the data byte stored in first register 22 and the data byte stored in second register 23. Also, the incoming data byte from the uncompressed data stream will be sent to compressor unit 10 via multiplexor 21 if there is a mismatch between the data byte stored in first register 22 (i.e. the incoming data byte) and the data byte stored in second register 23.

There is a preset value associated with first counter 25, and once this preset value is reached, any additional incoming data byte from the uncompressed data stream that still matches with its previous data byte from the uncompressed data stream will be discarded. This signifies an occurrence of a run condition within the uncompressed data stream. At this point, second counter 26 will be incremented instead for any matching condition between an incoming data byte and its previous data byte. When a mismatch finally occurs between an incoming data byte and its previous data byte, the accumulated count stored within second counter 26 will be passed on to compressor unit 10, followed by the mismatching incoming data byte.

The preset value for first counter 25 should be fairly small and a value of three, corresponding to a run length of four, is found to be quite optimal for most uncompressed data streams. Hence, all data bytes from an uncompressed data stream containing runs of less than the preset value of four will simply be passed on to compressor unit 10 for further processing according to the compressor algorithm utilized therein.

Because most adaptive compression algorithms are character-based, counters 25, 26 should preferably be of the same size as a character, typically eight bits long. If the run is exactly the same length as the preset value, then a count value of "00" is passed on to compressor unit 10. If the run is one byte longer than the preset value, a count of "01" is passed on to compressor unit 10, and so on. If 8-bit characters are in use, the highest value is utilized as a count continuation character.

Referring now to FIG. 3, there is illustrated a state diagram of a method for providing improved data compression efficiency for a data pre-compressor, in accordance with a preferred embodiment of the present invention. Starting at state (00), Available_Flag, First_Counter, Second_Counter are reset to zero, then go to state (01). In state (01), the pre-compressor waits for an input Data_Byte request. In state (02), a determination is made as to whether or not Available_Flag is set to 0; if yes, then go to state (04); if no, then go to state (03).

In state (03), a previously saved new Data_Byte is delivered to the Compressor. In state (04), a Data_Byte is fetched from the data source, then go to state (05). In state (05), a determination is made as to whether First_Counter is at Preset_Limit; if yes, then go to state (08); if no, then go to state (07).

In state (06), a determination is made as to whether or not the new Data_Byte is identical to the Previous_Byte; if yes, then go to state (08); if no, then go to state (07).

In state (07), the First_Counter is reset to zero, then go to state (09). In state (08), the First_Counter is incremented by 1, then go to state (09). In state (10), the new Data_Byte is delivered to the Compressor, then go to state (01).

In state (10), a determination is made as to whether or not the new Data_Byte is identical to the Previous_Byte; if yes, then go to state (13); if no, then go to state (11). In state (12), the Available_Flag is set to 1, then go to state (01).

In state (13), the Second_Counter is incremented by 1, then go to state (14). In state (14), a determination is made as to whether or not the Second_Counter is at its maximum value; if yes, then go to state (15); if no, then go to state (04).

In state (15), the Second_Counter value is delivered to the Compressor, then go to state (16). In state (16), the Second_Counter value is reset to "01," then go to state (01).

With reference now to FIG. 4, there is illustrated a high-level state diagram for the corresponding data post-compressor, in accordance with a preferred embodiment of the present invention. Starting at state (00), Extension_Flag, First_Counter, Second_Counter are reset to zero, then go to state (01).

In state (01), awaiting output of a new Data_Byte from the decompressor. In state (02), a determination is made as to whether or not Extension_Flag is set to 0; if yes, then go to state (13); if no, then go to state (03).

In state (03), a new Data_Byte value is loaded to the Second_Counter. In state (04), a determination is made as to whether or not the Second_Counter is at its maximum value; if yes, then go to state (09); if no, then go to state (05).

In state (05), the Extension_Flag is reset to zero, then go to state (06). In state (06), a determination is made as to whether or not the Second_Counter value is at 0; if yes, then go to state (00); if no, then go to state (07). In state (08), the previous Data_Byte is delivered to the output, then go to state (08). In state (08), the Second_Counter is decremented by 1, then go to state (06).

In state (09), the Extension_Flag is set to 1, then go to state (10). In state (10), the previous Data_Byte is delivered to the output, then go to state (11). In state (11), the Second_Counter is decremented by 1, then go to state (12). In state (12), a determination is made as to whether or not the Second_Counter value is greater than 1; if yes, then go to state (10); if no, then go to state (01).

In state (13), a determination is made as to whether or not the First_Counter is at a Preset_Limit; if yes, then go to state (03); if no, then go to state (14).

In state (14), the new Data_Byte value is delivered to the output, then go to state (15). In state (15), a determination is made as to whether or not the new Data_Byte is identical to the Previous_Byte; if yes, then go to state (17); if no, then go to state (16). In state (16), the First_Counter value is reset to zero, then go to state (01). In state (17), the First_Counter is incremented by 1, then go to state (01).

Table I is an example illustrating the results from pre-compressor unit 20 based on the incoming data stream, in accordance with a preferred embodiment of the present invention. In this example, the preset value is set to three and an 8-bit symbol (one byte) is utilized.

TABLE I

| INPUT DATA STREAM | INPUT TO COMPRESSOR |
| --- | --- |
| C3 02 02 02 A7 | C3 02 02 20 A7 |
| 96 FF FF FF FF A2 | 96 FF FF FF FF 00 A2 |
| 31 30 30 30 30 39 | 31 30 30 30 30 01 39 |
| 0A 40 . . . (a run of 9) . . . 40 C3 | 0A 40 40 40 40 05 C3 |
| 64 00 . . . (a run of 258) . . . 00 32 | 64 00 00 00 00 FE 32 |
| 9B 00 . . . (a run of 259) . . . 00 8D | 9B 00 00 00 00 FF 00 8D |
| 20 40 . . . (a run of 260) . . . 40 20 | 20 40 40 40 40 FF 01 20 |

As has been described, the present invention provides a method and apparatus for providing improved data compression efficiency to a compressor unit. Although a compressor unit is utilized throughout the entire disclosure for the purpose of illustration, it is understood by those skilled in the art that a pre-compressor as described must also utilize a corresponding post-decompressor. Such post-decompressor is preferably coupled between decompressor unit 15 and data sink 18 of FIG. 1b.

A post-decompressor performs the inverse operation of a pre-compressor. Each data byte output from a de-compressor unit is compared to its previous data byte and a counter is incremented or is reset. If the counter reaches the preset value, then the next data byte is treated as a count representing how many additional copies of the last value output constitute the continuation of the run, and must be copied out before decoding any more compressed data bytes.

For both a pre-compressor and a post-decompressor, the maximum count symbol value is utilized to denote a count of this value but that this count is continued on the next symbol, which must be processed according to the same rule. The use of count continuation characters in this manner permit runs of any length to be encoded, with a penalty of one symbol for runs of length exactly equal to the preset threshold value.

In terms of hardware, the present invention only requires an extra register to hold the previous data symbol, a comparator, and a counter, along with a small amount of control logic. In fact, for a Content-Addressable Memory (CAM) based compressor, the register already exists in hardware, but in any event, the extra silicon area utilized to implement the present invention is negligible.

In addition, the present invention can be applied to any kind of compression algorithms, and clearly can provide considerable compression in and of itself for long runs of data (in excess of 250:1 for 8-bit symbols). In the case of general-purpose adaptive compression algorithms, this is an important advantage, because such compression algorithms generally adapt without regard to whether or not a stream of incoming data should be utilized to adapt the compression algorithm. An Lempel-Ziv 1 algorithm, for example, can only achieve a maximum compression ratio of about 90:1 for a long run of identical data.

While the invention has been particularly shown and described with reference to a preferred embodiment, it will be understood by those skilled in the art that various changes in form and detail may be made therein without departing from the spirit and scope of the invention.

What is claimed is:

1. A method for providing improved data compression efficiency to a data compressor unit, said method comprising the steps of:

comparing an incoming data byte and a previous data byte from an uncompressed data stream, wherein said uncompressed data stream is to be received by said data compressor unit;

incrementing a first counter value in response to a match between said incoming data byte and said previous data byte;

incrementing a second counter value in response to said first counter value reaches a preset value to indicate a run within said uncompressed data stream;

substituting said run within said uncompressed data stream with said second counter value; and transmitting said uncompressed data stream to said data compressor unit such that said data compressor can quickly resume an optimal compression ratio after an occurrence of said run within said uncompressed data stream.

2. The method for providing improved data compression efficiency to a data compressor unit according to claim 1, wherein said method further includes a step of resetting said first counter in response to a mismatch between said incoming data byte and said previous data byte.

3. The method for providing improved data compression efficiency to a data compressor unit according to claim 1, wherein said step of incrementing a second counter value further includes a step of incrementing a second counter value in response to a subsequent match between an incoming data byte and a previous data byte.

4. The method for providing improved data compression efficiency to a data compressor unit according to claim 3, wherein said method further includes a step of discarding said incoming data byte.

5. The method for providing improved data compression efficiency to a data compressor unit according to claim 1, wherein said completion of a run is indicated by a mismatch between an incoming data byte and a previous data byte.

6. A method for providing improved data compression efficiency to a data compressor unit, said method comprising the steps of:

preprocessing an uncompressed data stream by comparing an incoming data byte and a previous data byte from said uncompressed data stream, wherein said uncompressed data stream is to be received by said data compressor unit;

incrementing a first counter value in response to a match between said incoming data byte and said previous data byte to indicate a beginning of a run within said uncompressed data stream;

incrementing a second counter value in response to a subsequent match between an incoming data byte and a previous data byte after said first counter value has reached a preset value to indicate a remaining portion of said run within said uncompressed data stream;

substituting said remaining portion of said run within said uncompressed data stream with said second counter value; and transmitting said uncompressed data stream embedded with said second counter value to said data compressor unit such that said data compressor can quickly resume an optimal compression efficiency despite an occurrence of said run within said uncompressed data stream.

7. The method for providing improved data compression efficiency to a data compressor unit according to claim 6, wherein said method further includes a step of resetting said first counter in response to a mismatch between said incoming data byte and said previous data byte.

8. The method for providing improved data compression efficiency to a data compressor unit according to claim 6, wherein said method further includes a step of discarding said incoming data byte.

9. The method for providing improved data compression efficiency to a data compressor unit according to claim 6, wherein said completion of a run is indicated by a mismatch between an incoming data byte and a previous data byte.

10. A pre-compressor for providing improved data compression efficiency to a data compressor unit, comprising:

a comparator for comparing an incoming data byte and a previous data byte from an uncompressed data stream, wherein said uncompressed data stream is to be received by said data compressor unit;

a first counter for counting a number of matches between said incoming data byte and said previous data byte, wherein said first counter is coupled with said comparator;

a second counter for counting a number of matches between said incoming data byte and said previous data byte after said first counter reaches a preset value, wherein said second counter is coupled said comparator; and a transmitter for sending a value of said second counter to said data compressor unit at a completion of a run of said incoming data byte such that said data compressor can quickly resume back to its optimal compression ratio after an occurrence of said run within said uncompressed data stream.

11. The pre-compressor according to claim 10, wherein said pre-compressor further includes a reset for resetting said first counter in response to a mismatch between said incoming data byte and said previous data byte.

12. The pre-compressor according to claim 10, wherein said pre-compressor further includes a means for discarding said incoming data byte during the increment of said second counter.

13. The pre-compressor according to claim 10, wherein said completion of a run is indicated by a mismatch between an incoming data byte and a previous data byte.

14. The pre-compressor according to claim 10, wherein said pre-compressor further includes a means for substituting said run within said uncompressed data stream with said second counter value.

* * * * *